United States Patent [19]

Bloom

[11] Patent Number: 5,347,176

[45] Date of Patent: Sep. 13, 1994

[54] ANALOG RAMP GENERATOR WITH DIGITAL CORRECTION

[75] Inventor: Alan R. Bloom, Santa Rosa, Calif.

[73] Assignee: Hewlett-Packard Company, Palo Alto, Calif.

[21] Appl. No.: 18,948

[22] Filed: Feb. 17, 1993

[51] Int. Cl.$^5$ .......................... H03K 6/00; H03K 4/08
[52] U.S. Cl. .................... 307/490; 307/227; 307/228; 307/494
[58] Field of Search .............. 307/228, 263, 261, 227, 307/355, 490, 494, 262; 328/181, 186

[56] References Cited

U.S. PATENT DOCUMENTS

| 3,826,928 | 7/1974 | Bucek et al. | 307/228 |
| 3,950,706 | 4/1976 | Wilson | 328/181 |
| 4,581,585 | 4/1986 | Bristol | 307/228 |

Primary Examiner—Timothy P. Callahan
Assistant Examiner—My-Trang Nu Ton
Attorney, Agent, or Firm—William C. Milks, III

[57] ABSTRACT

An analog ramp signal is used to control the frequency of a swept radio-frequency (RF) test oscillator. The analog ramp signal is generated by applying a fixed reference voltage to an analog integrator circuit. However, ramp accuracy is degraded by integrator gain error, drift, and nonlinearity. To correct for these errors, the analog ramp signal is periodically compared to a digital ramp signal generated by a digital-to-analog converter (DAC) during the course of a sweep. Preferably, the analog ramp signal is compared to the digital ramp signal many times during the course of the sweep. The difference between the two ramp signals is scaled and combined with the reference voltage to correct the slope of the analog ramp signal. An additional DAC preferably adjusts the gain of the feedback loop.

20 Claims, 5 Drawing Sheets

ANALOG RAMP GENERATOR WITH DIGITAL CORRECTION

BACKGROUND OF THE INVENTION

This invention relates to the field of electronic instruments for producing swept-frequency electrical signals and, more particularly, to such instruments that are capable of producing swept-frequency analog electrical signals over a predetermined range of frequencies. Specifically, one embodiment of the invention provides a method and apparatus for digitally correcting an analog ramp signal used to generate the swept-frequency analog signal produced by such an electronic instrument.

The design and implementation of radio-frequency (RF) devices, such as transmitters, receivers, filters, and test equipment, is facilitated by using an electronic instrument in the form of a test oscillator whose output frequency can be swept over a predetermined frequency range. Generally, there are two types of test oscillators, namely, analog sweepers and stepped sweepers. Analog sweep is preferable to stepped sweep in many instances, because there are no discontinuities in frequency as the output frequency of the test oscillator is swept. In contrast, in the case of stepped sweep, the output frequency of the test oscillator is incremented from one discrete frequency to another, and, consequently, a narrow frequency "glitch" in the response of an RF device under test may not evidence itself, if the glitch were to occur between discrete frequency steps.

Typically, in a test oscillator which produces a swept-frequency analog signal, the frequency is controlled by an analog voltage ramp. Therefore, any inaccuracy in the analog voltage ramp directly affects swept-frequency accuracy.

Known analog ramp generators that produce analog voltage ramps incorporate an analog integrator circuit to generate the analog voltage ramp to sweep the output frequency of the test oscillator. The sweep rate is typically controlled by a digital-to-analog converter (DAC) referred to as the sweep-rate DAC which is set by a central processing unit (CPU). A calibration procedure is required to correct the analog voltage ramp to achieve initial swept-frequency accuracy of the test oscillator. However, analog integrator circuits tend to drift with time and with variations in temperature during continued operation of the test oscillator.

One previous technique to correct for drift of the analog integrator circuit that causes swept-frequency inaccuracy during continued operation of a test oscillator is to include an analog-to-digital converter (ADC) to measure the end-of-sweep voltage, that is, the analog ramp voltage at the highest frequency of the predetermined range of frequencies over which the test oscillator is swept. The CPU reads the ADC, calculates the voltage deviation from a desired value, and adjusts the number loaded into the sweep-rate DAC on subsequent sweeps to provide correction.

There are three main disadvantages to this technique. One is complexity. ADCs are more complicated than DACs. Also, the CPU must be active at the end of every sweep to read the ADC and correct the setting of the sweep-rate DAC. Secondly, there is a one-sweep time lag between error measurement and correction. For example, the first sweep after operation of the test oscillator is initiated is uncorrected. Finally, although the start-of-sweep voltage is well-controlled and the end-of-sweep voltage is corrected using the ADC, the analog voltage ramp accuracy at intermediate points is uncorrected and depends on the linearity of the analog integrator circuit.

Therefore, a method and apparatus for providing correction of the analog voltage ramp are needed so that the swept-frequency accuracy of the test oscillator is improved. Moreover, such a correction desirably would be highly accurate and rapidly obtained.

SUMMARY OF THE INVENTION

It is an object of the present invention to generate a true analog voltage ramp with real-time digital correction for the gain error, drift, and nonlinearity of the analog integrator circuit incorporated into an analog ramp generator.

It is another object of the present invention to correct the analog voltage ramp without repetitive calibration by the CPU.

The foregoing objects are achieved in one illustrative embodiment of the invention in which a digital voltage ramp is generated to correct errors in the analog voltage ramp produced by an analog ramp generator. Preferably, a digital-ramp DAC generates a stepped voltage ramp simultaneously with the analog voltage ramp. The two ramps are compared whenever the stepped voltage ramp is incremented, and a sampled error voltage is fed back to the analog integrator circuit to correct for any integrator errors. The resulting analog voltage ramp reflects the accuracy and stability of the digital-ramp DAC, while retaining a true analog sweep characteristic.

In one preferred embodiment, the digital voltage ramp consists of 101, 201, 401, 801, or 1601 equally-sized discrete steps. The number of steps depends on the selected sweep time. In the middle of each step, the analog voltage ramp is compared to the digital voltage ramp. The difference is scaled by an amount that depends on the number of steps per sweep. The scaled difference is sampled to obtain an error signal, and the error signal is amplified and combined with a constant DC reference that is used to generate the analog voltage ramp. The combined signal is then scaled by an amount that depends on the sweep rate and fed to the analog integrator circuit to generate a corrected analog voltage ramp.

After each frequency sweep terminates, a retrace circuit rapidly returns the output of the analog integrator circuit to a starting voltage level. A timing and control circuit increments the digital-ramp DAC at the proper times and controls the timing of the analog ramp generator, retrace circuit, and error voltage sampling circuit.

Furthermore, the CPU need only set up the circuit once. No further CPU intervention is required to correct for drift in analog circuitry.

In one embodiment, the corrected analog voltage ramp is scaled and offset a proper amount to sweep a voltage-controlled RF oscillator circuit over a predetermined frequency range. The inventive configuration allows a true analog sweep, while providing the accuracy and stability of a stepped sweep.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings.

DETAILED DESCRIPTION OF THE PREFERRED EMBODIMENTS

Figure 1:
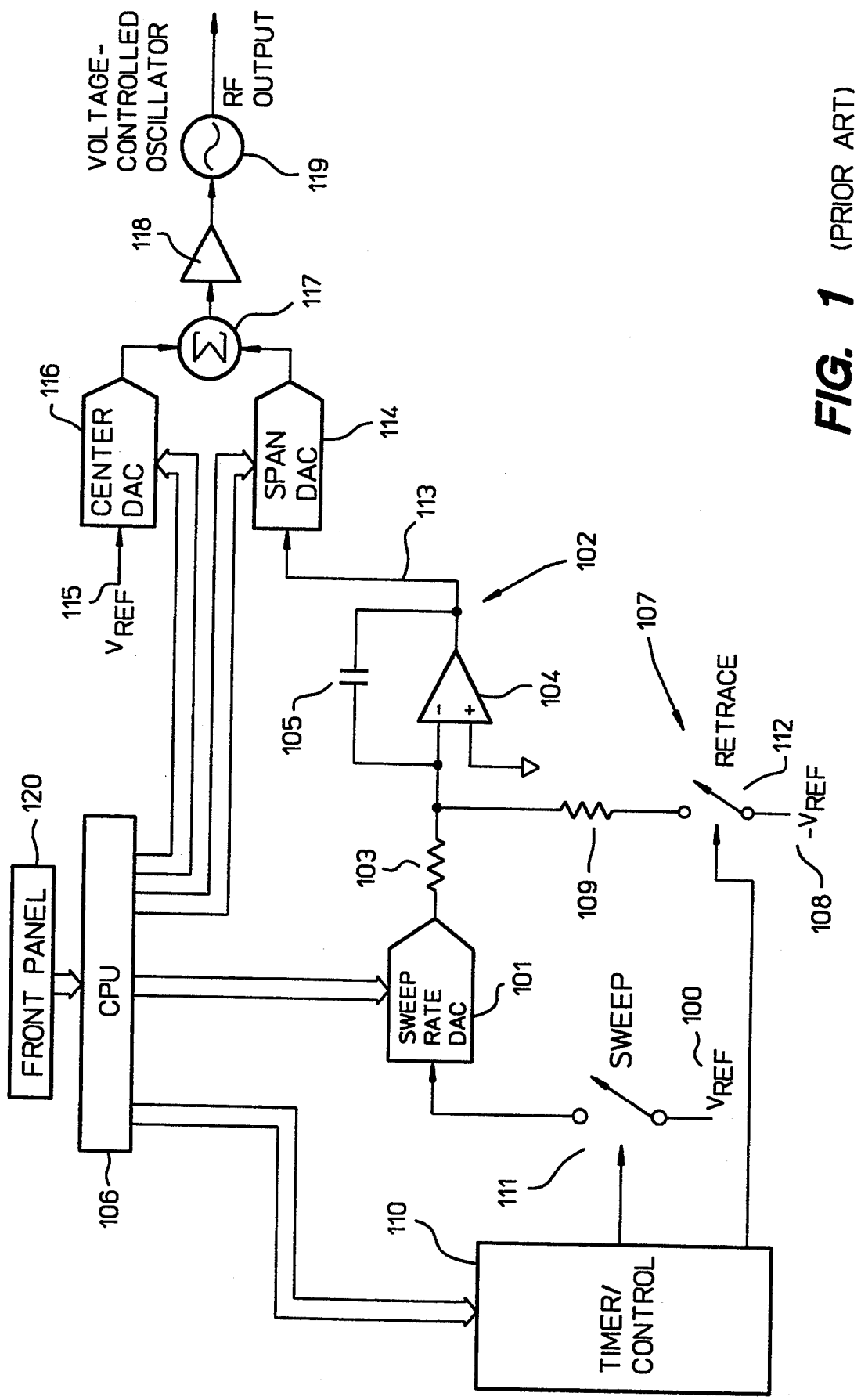
FIG. 1 is a block schematic diagram of a prior art uncorrected analog ramp generator.

FIG. 1 shows a prior art analog ramp generator for use with swept-frequency RF test oscillators. As shown in FIG. 1, a highly-stable DC voltage reference $V_{REF}$ 100 is selectively connected to an analog input of a first multiplying digital-to-analog converter (DAC) 101 hereafter referred to as the sweep-rate DAC 101. An analog output of the sweep-rate DAC 101 is applied to an input of an analog integrator circuit 102. The analog integrator circuit 102 is conventional and comprises an input resistor 103 which connects the analog output of the sweep-rate DAC 101 to the inverting input of an operational amplifier 104 having a capacitor 105 connected between the output of the operational amplifier and the inverting input of the operational amplifier. The non-inverting input of the operational amplifier 104 is connected to common. A central processing unit (CPU) 106 loads the sweep-rate DAC 101 with a digital control word (i.e., a number) to obtain the desired sweep rate.

The sweep rate actually depends on the values of the input resistor 103 and the capacitor 105, as well as the setting of the sweep-rate DAC 101. When the analog ramp generator is manufactured, measurements of sweep speed versus setting of the sweep-rate DAC 101 are performed, and a resulting calibration constant is derived. The CPU 106 can then multiply the calibration constant by the desired sweep speed to calculate the appropriate number to download into the sweep-rate DAC 101 so that the desired sweep rate is achieved.

A retrace circuit 107 returns the output of the analog integrator circuit 102 to its starting level at the conclusion of each sweep. The retrace circuit 107 comprises a DC voltage reference $-V_{REF}$ 108 which is selectively connected via a second input resistor 109 to the inverting input of the operational amplifier 104. A timer/control circuit 110 operates a sweep switch 111 to apply the DC voltage reference $V_{REF}$ 100 which comprises the forward-sweep signal to the analog input of the sweep-rate DAC 101 at the proper time to start the sweep and disconnects the DC voltage reference $V_{REF}$ 100 from the analog input of the sweep-rate DAC at the end of each sweep. The timer/control circuit 110 also operates a retrace switch 112 at the correct time to connect the DC voltage reference $-V_{REF}$ 108 via the second input resistor 109 to the analog integrator circuit 102 prior to the start of a sweep and disconnects the DC voltage reference $-V_{REF}$ 108 before a sweep begins.

As shown in FIG. 1, the analog voltage ramp at the output of the analog integrator circuit 102 is connected via a line 113 to an analog input of a second multiplying DAC 114 hereafter referred to as the span DAC 114. The CPU 106 loads the proper number into the span DAC 114 so that the desired frequency span is swept. Additionally, a DC voltage reference $V_{REF}$ 115 is scaled by a third multiplying DAC 116 hereafter referred to as the center-frequency DAC 116. The CPU 106 loads the appropriate number into the center-frequency DAC 116 so that the center frequency of the desired frequency span is properly set. The analog output of the center-frequency DAC 116 is summed with the analog output of the span DAC 114 by an analog summer 117 to produce a control voltage proportional to frequency. This control voltage, which is proportional to frequency, is preferably amplified by an amplifier 118 and applied to a voltage-controlled oscillator 119, whose frequency is assumed to be linearly proportional to the applied control voltage.

A user selects a sweep time and enters a desired frequency span and center frequency by means of a front panel 120. The CPU 106 downloads numbers into the sweep-rate DAC 101, span DAC 114, center-frequency DAC 116, and timer/control circuit 110 based on the sweep time, frequency span, and center frequency entered by the user.

Swept-frequency accuracy of the voltage-controlled oscillator 119 shown in FIG. 1 depends on the accuracy of the analog voltage ramp that appears on the line 113. The accuracy of the analog voltage ramp in turn depends on the accuracy of the above-mentioned sweep-rate calibration and on the stability of the analog integrator circuit 102. Unfortunately, with the passage of time, or with changes in temperature, the parameters of the first input resistor 103, operational amplifier 104, and capacitor 105 can change, which will degrade swept-frequency accuracy.

Figure 2:
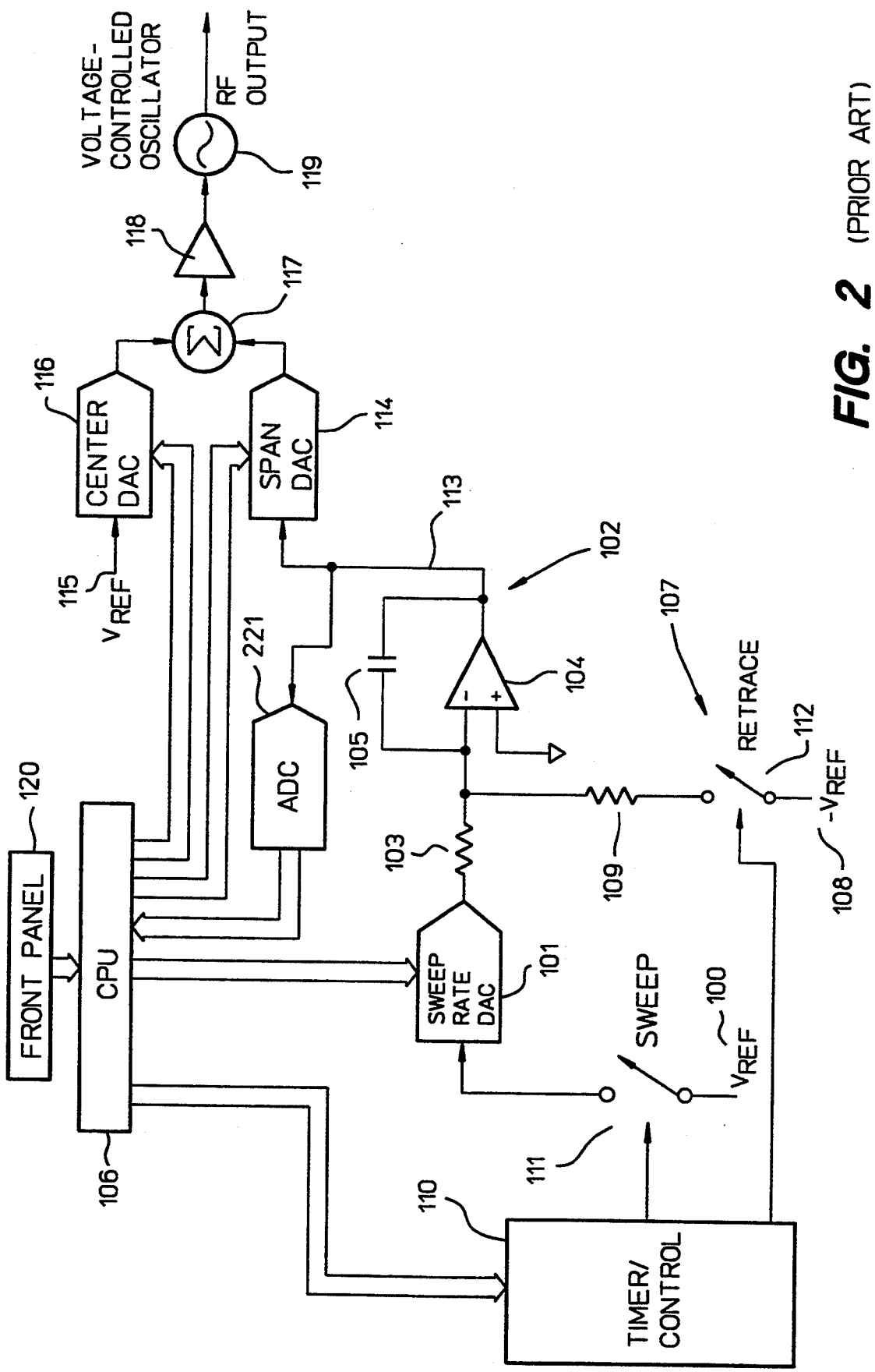
FIG. 2 is a prior art modification of the circuit shown in FIG. 1, which incorporates an analog-to-digital converter to measure an end-of-sweep error voltage that is used by a central processing unit to correct subsequent sweeps.

The prior art circuit shown in FIG. 2 illustrates a partial solution to this problem. The circuit shown in FIG. 2 is identical to the circuit shown in FIG. 1 except for the addition of an analog-to-digital converter (ADC) 221. Otherwise, the correspondence between elements in FIG. 1 and in FIG. 2 is indicated by identical elements being labeled in FIG. 2 by the same numerals employed in FIG. 1.

At the end of each sweep, before retrace, the CPU 106 shown in FIG. 2 reads the analog ramp voltage on the line 113 measured by the ADC 221. The CPU 106 shown in FIG. 2 then calculates the deviation from the desired end-of-sweep voltage, derives a new calibration constant for the sweep-rate DAC 101, and uses the new calibration constant to calculate an adjusted number for the sweep-rate DAC, which is loaded into the sweep-rate DAC before the next sweep begins. Consequently, the sweep-rate DAC 101 shown in FIG. 2 scales the DC voltage reference $V_{REF}$ 100 using the adjusted number with the objective that the end-of-sweep voltage for the next sweep will equal the end-of-sweep voltage of the analog voltage ramp that produces the desired end-of-sweep frequency of the voltage-controlled oscillator 119.

However, the prior art circuit shown in FIG. 2 eliminates only some of the effects of drift of the parameters of the analog integrator circuit 102. Unfortunately, especially for very slow sweeps, short-term changes in parameters, due to thermal effects and component non-linearities, can still cause errors in the analog voltage ramp.

Figure 3:
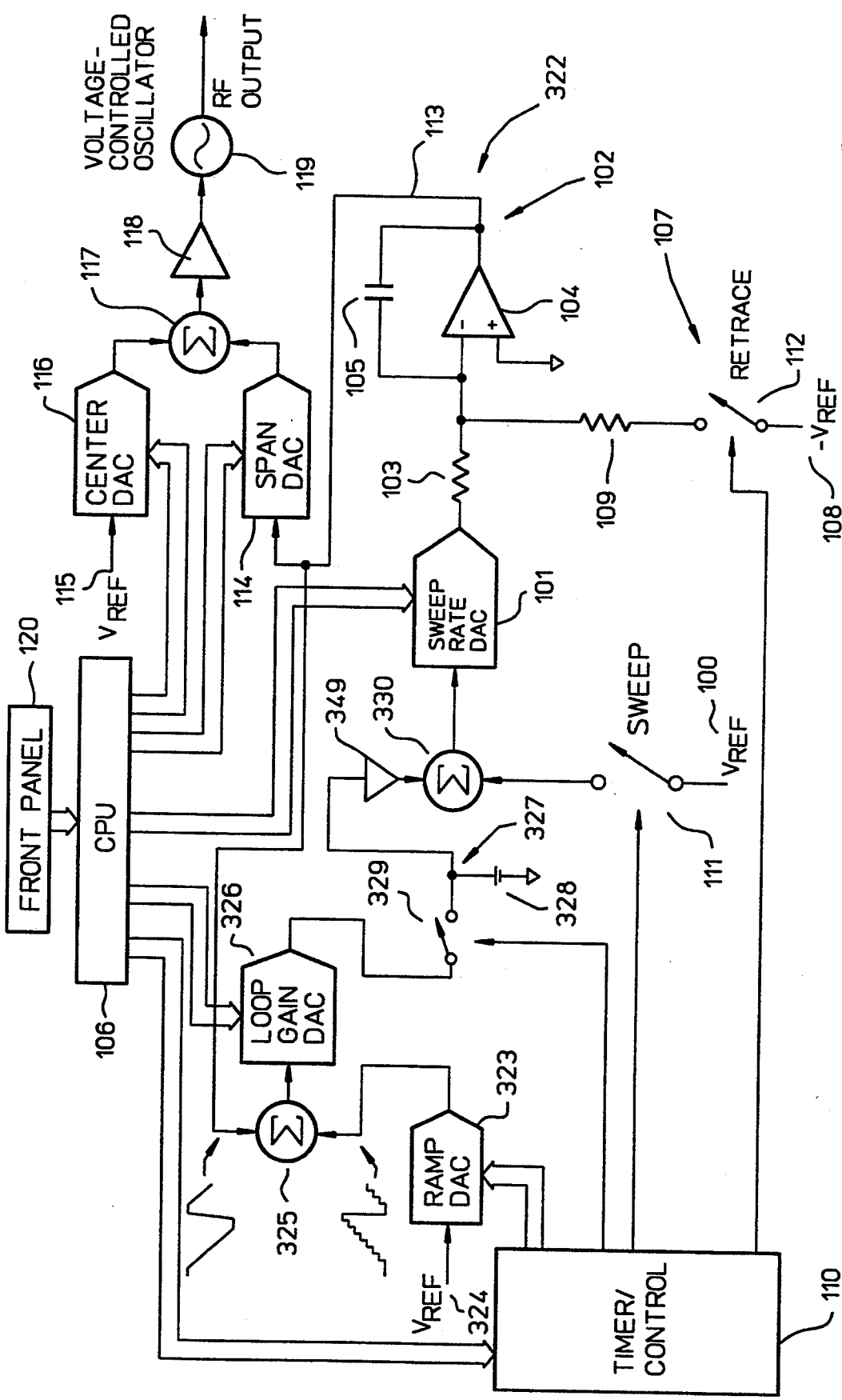
FIG. 3 is a block schematic diagram of one embodiment of a digitally-corrected analog ramp generator in accordance with the invention.

One embodiment of a digitally-corrected analog ramp generator in accordance with the invention for achieving calibrated, accurate, convenient correction of the analog voltage ramp, generally indicated by the numeral 322, is shown in FIG. 3. In FIG. 3, elements corresponding to those in FIGS. 1 and 2 have been labeled with corresponding numerals. For example, the sweep-rate DAC 101 shown in FIG. 3 corresponds to the sweep-rate DACs 101 shown in FIGS. 1 and 2. A comparison of FIG. 3 with FIG. 1 shows that several new elements have been added in accordance with the invention to improve swept-frequency accuracy.

In particular, as shown in FIG. 3, the timer/control circuit 110 now controls a fourth multiplying DAC 323 hereafter referred to as the digital-ramp DAC 323 so that an analog output of the digital-ramp DAC steps as the analog voltage ramp is generated by the analog integrator circuit 102. That is, the timer/control circuit 110 loads incremented counts into the digital-ramp DAC 323 so that the digital-ramp DAC variably scales a DC voltage reference $V_{REF}$ 324 to generate a digital voltage ramp, or staircase, which sweeps in step with the analog voltage ramp that appears on the line 113. The two voltage ramps are compared (summed by a second analog summer 325), and the resulting difference voltage is scaled by a fifth multiplying DAC 326 hereafter referred to as the loop-gain DAC 326.

With each step change in the digital voltage staircase, a sample-and-hold circuit 327, comprising a capacitor 328 and a sample-and-hold switch 329 controlled by the timer/control circuit 110, samples the scaled voltage at the analog output of the loop-gain DAC 326 to produce an error voltage and holds the error voltage until the next step occurs. The error voltage which appears at the output of the sample-and-hold circuit 327 is amplified by an amplifier 349 and added to the DC voltage reference $V_{REF}$ 100 by a third analog summer 330, and the resulting combined voltage is scaled by the sweep-rate DAC 101. The remainder of the circuit shown in FIG. 3 is identical to the circuit shown in FIG. 1.

The CPU 106 downloads a number into the loop-gain DAC 326 to provide a loop gain of one. That is, if the analog voltage ramp is in error by X volts when the error voltage is sampled by the sample-and-hold circuit 327, the sweep rate of the analog integrator circuit 102 will change by $-X$ volts per step, so that the analog voltage ramp will attain the correct value by the next time that the error voltage is sampled. The CPU 106 changes the gain provided by the loop-gain DAC 326 in proportion to the number of steps per sweep. The more steps per sweep, the greater the required change in ramp rate to achieve zero error by the next sample time.

The operation of the digitally-corrected analog ramp generator 322 will now be described with reference to FIGS. 3 to 5. Prior to initiation of a sweep by the analog ramp generator 322, a user enters the sweep time, frequency span, and center frequency by means of the front panel 120 such as a keyboard. For example, the user can enter a sweep time as short as 10 milliseconds or as long as 100 seconds.

During initialization, the sweep switch 111 is open, and the retrace switch 112 is open. (This assumes that a previous retrace is complete.) In order to initialize the digitally-corrected analog ramp generator 322, as indicated by the numeral 331 shown in FIG. 5, the CPU 106 reads the sweep time selected by the user and computes a number that is loaded into the sweep-rate DAC 101. The number that the CPU 106 loads into the sweep-rate DAC 101 depends on the magnitude of the DC voltage reference $V_{REF}$ 100 and the parametric values of the first input resistor 103 and the capacitor 105. The number that the CPU 106 loads into the sweep-rate DAC 101 is determined so that, when the DC voltage reference $V_{REF}$ 100 is multiplied by this number and fed to the analog integrator circuit 102, the analog voltage ramp at the output of the analog integrator circuit transitions from a level equal to the magnitude of the retrace voltage to a level equal to the desired end-of-sweep voltage during the time of one sweep. The faster the sweep, the shorter the sweep time, and the larger the number that the CPU 106 loads into the sweep-rate DAC 101. That is, the number downloaded into the sweep-rate DAC 101 by the CPU 106 changes the slope of the analog voltage ramp that appears on the line 113 so that the analog voltage ramp is generated within the sweep time selected by the user. The faster the sweep, the higher the number loaded into the sweep-rate DAC 101 by the CPU 106, and the greater the slope of the analog voltage ramp produced by the analog integrator circuit 102. The CPU 106 also reads the frequency span entered by the user and loads a number into the span DAC 114 which scales the analog voltage ramp that appears on the line 113 so that the amplitude of the analog voltage ramp that appears on the line 113 produces the desired portion of the frequency range of the voltage-controlled oscillator 119 during the selected sweep time. Additionally, the CPU 106 reads the center frequency entered by the user and loads a number into the center-frequency DAC 116 which is used to multiply the DC voltage reference $V_{REF}$ 115 to provide an offset that establishes the center frequency of the span of frequencies over which the voltage-controlled oscillator 119 is swept. Furthermore, in accordance with the invention, the CPU 106 loads a number into the loop-gain DAC 326 to assure that the gain of the feedback loop used to digitally correct the analog voltage ramp is unity. Finally, the CPU 106 loads the number of steps per sweep and the number of microseconds per step into the timer/control circuit 110 for controlling the digital-ramp DAC 323. The digital voltage ramp can consist of 101, 201, 401, 801, or 1601 equally-sized discrete steps. The number of steps depends on the sweep time selected by the user, and the number of microseconds per step is determined by dividing the selected sweep time by the number of steps minus one. For example, if the selected sweep time is one second, the number of steps can be 1601 and the number of microseconds per step can be 625. This completes initialization of the digitally-corrected analog ramp generator 322.

Next, the CPU 106 prompts the timer/control circuit 110 to initiate a sweep. The timer/control circuit 110 controls the length of time that the analog integrator circuit 102 operates, which in turn depends on the sweep time selected by the user. That is, the timer/control circuit 110 controls the start and stop times of the analog integrator circuit 102. Specifically, the timer/control circuit 110 closes the sweep switch 111 at a start time T1, as illustrated by the numeral 332 shown in FIG. 4 and as indicated by the numeral 333 shown in FIG. 5. Consequently, the DC voltage reference $V_{REF}$ 100 is fed through the third analog summer 330 to the analog input of the sweep-rate DAC 101 and is multiplied by the number loaded into the sweep-rate DAC by the CPU 106 during initialization. The number downloaded into the sweep-rate DAC 101 by the CPU 106 assures that the amplitude of the voltage which appears at the analog output of the sweep-rate DAC is at a level so that the desired frequency range will be swept in the selected sweep time that occurs while the sweep switch 111 is closed. The resulting voltage appears at the analog output of the sweep-rate DAC 101 and is fed to the analog integrator circuit 102.

Figure 4:
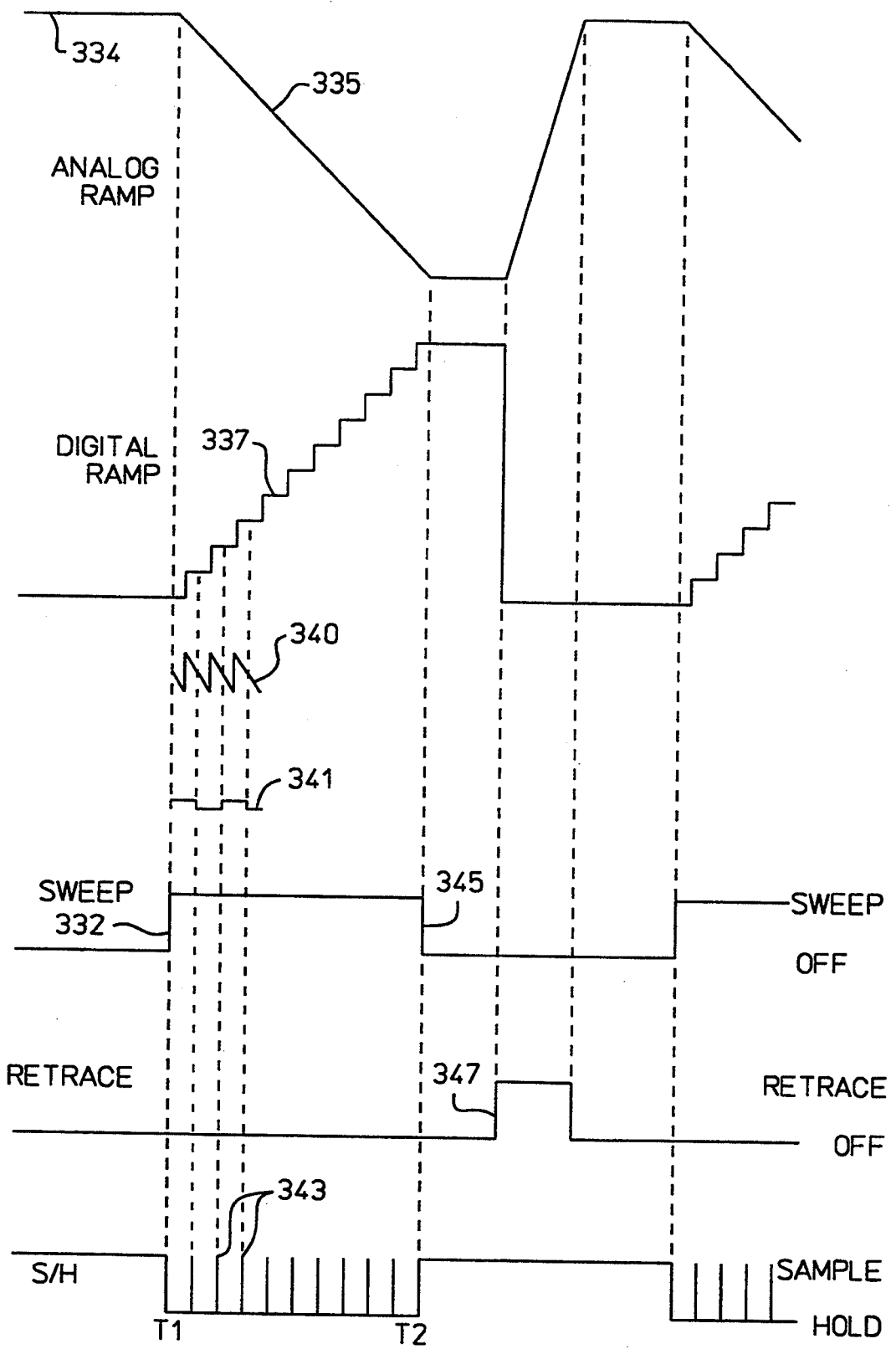
FIG. 4 is a timing diagram of signals that control the analog ramp generator, digital ramp generator, sample-and-hold circuit, and retrace circuit of the digitally-corrected analog ramp generator in accordance with the invention shown in FIG. 3.

As illustrated by the numeral 334 shown in FIG. 4, the output of the analog integrator circuit 102 is initially set at the magnitude of the retrace voltage (for example, +10 VDC). The output of the analog integrator circuit 102 therefore transitions from a positive voltage, for example, +10 VDC, to a negative voltage, for example −10 VDC, during integration of the voltage which appears at the analog output of the sweep-rate DAC 101, as illustrated by the numeral 335 shown in FIG. 4 and as indicated by the numeral 336 shown in FIG. 5. The +10 VDC to −10 VDC range allows the output of the operational amplifier 104 to be symmetrical about zero VDC and permits utilization of the entire dynamic range of the operational amplifier. The analog voltage ramp that appears on the line 113 shown in FIG. 3 is:

$$V_{OUT102}(t) = \frac{1}{C_{105}} \int_{T1}^{t} \frac{V_{DAC101}}{R_{103}} dt + V_{RETRACE}$$

$$= (t - T1)\left(\frac{1}{R_{103}C_{105}}\right)V_{DAC101} + V_{RETRACE}$$

where $$V_{DAC101} = (V_{REF100})(DAC_{101})$$

The analog voltage ramp at the output of the analog integrator circuit 102 that appears on the line 113 is fed to the span DAC 114. The span DAC 114 is set by the number downloaded by the CPU 106 during initialization to scale the analog voltage ramp so that the desired frequency range is swept from a start frequency F1 to a stop frequency F2 during the sweep time selected by the user. The frequency span that determines the start frequency F1 and the stop frequency F2 is entered by the user by means of the front panel 120. Without the span DAC 114, the analog voltage ramp at the output of the analog integrator circuit 102 that appears on the line 113 would always cause the entire available frequency range of the voltage-controlled oscillator 119 to be swept. The analog output of the span DAC 114 is summed with a voltage at the analog output of the center-frequency DAC 116 by means of the first analog summer 117. The center-frequency DAC 116 is set by the number downloaded by the CPU 106 during initialization based on the center frequency entered by the user to provide an offset which, when added to the voltage at the analog output of the span DAC 114 by the first analog summer 117, establishes the center frequency of the frequency span determined by the scaled analog voltage ramp produced by the span DAC.

In accordance with the invention, the timer/control circuit 110 loads a number into the digital-ramp DAC 323 during the sweep and increments the number until the end of the sweep. The incrementing number scales the DC voltage reference $V_{REF}$ 324 connected to the analog input of the digital-ramp DAC 323 so that a digital voltage ramp, or staircase, is generated by the digital-ramp DAC during the sweep, as illustrated by the numeral 337 shown in FIG. 4 and as indicated by the numeral 338 shown in FIG. 5. The staircase voltage appears at the analog output of the digital-ramp DAC 323 shown in FIG. 3 and is fed to the second analog summer 325. Also, the analog voltage ramp that appears on the line 113 is fed to the second analog summer 325. Since the operational amplifier 104 is inverting, the analog voltage ramp is negative-going. Additionally, the analog output of the digital-ramp DAC 323 can be controlled so that the analog output of the staircase is opposite in polarity to the polarity of the analog ramp voltage that appears on the line 113. Furthermore, input resistors (not shown) connected to the input of the second analog summer 325 can be selected to appropriately scale the voltage at the analog output of the digital-ramp DAC 323 and the analog ramp voltage that appears on the line 113. Consequently, the second analog summer 325 actually performs a comparison (subtraction) when the staircase voltage generated by the digital-ramp DAC 323 is added to the analog voltage ramp that appears on the line 113 by the second analog summer 325, as indicated by the numeral 339 shown in FIG. 5. The resulting difference voltage is preferably scaled by the loop-gain DAC 326, which assures unity gain for the error correction circuit, to produce a scaled voltage, as illustrated by the numeral 340 shown in FIG. 4. The scaled difference voltage is then sampled by the sample-and-hold circuit 327 shown in FIG. 3 to produce an error voltage, as illustrated by the numeral 341 shown in FIG. 4 and as indicated by the numeral 342 shown in FIG. 5. Preferably, the timer/control circuit 110 shown in FIG. 3 operates the sample-and-hold switch 329 intermediate the times that successive steps of the digital voltage staircase are generated by the digital-ramp DAC 323, as illustrated by the numeral 343 shown in FIG. 4. The error voltage which appears at the output of the sample-and-hold circuit 327 shown in FIG. 3 is amplified and fed to the third analog summer 330, which causes the DC voltage reference $V_{REF}$ 100 fed via the sweep-rate DAC 101 to the analog integrator circuit 102 to be adjusted so that the analog voltage ramp that appears on the line 113 is forced to track the sample points of the digital staircase voltage, as indicated by the numeral 344 shown in FIG. 5, to correct for drift of the analog integrator circuit 102, while providing a continuous analog voltage ramp to the voltage-controlled oscillator 119.

Figure 5:
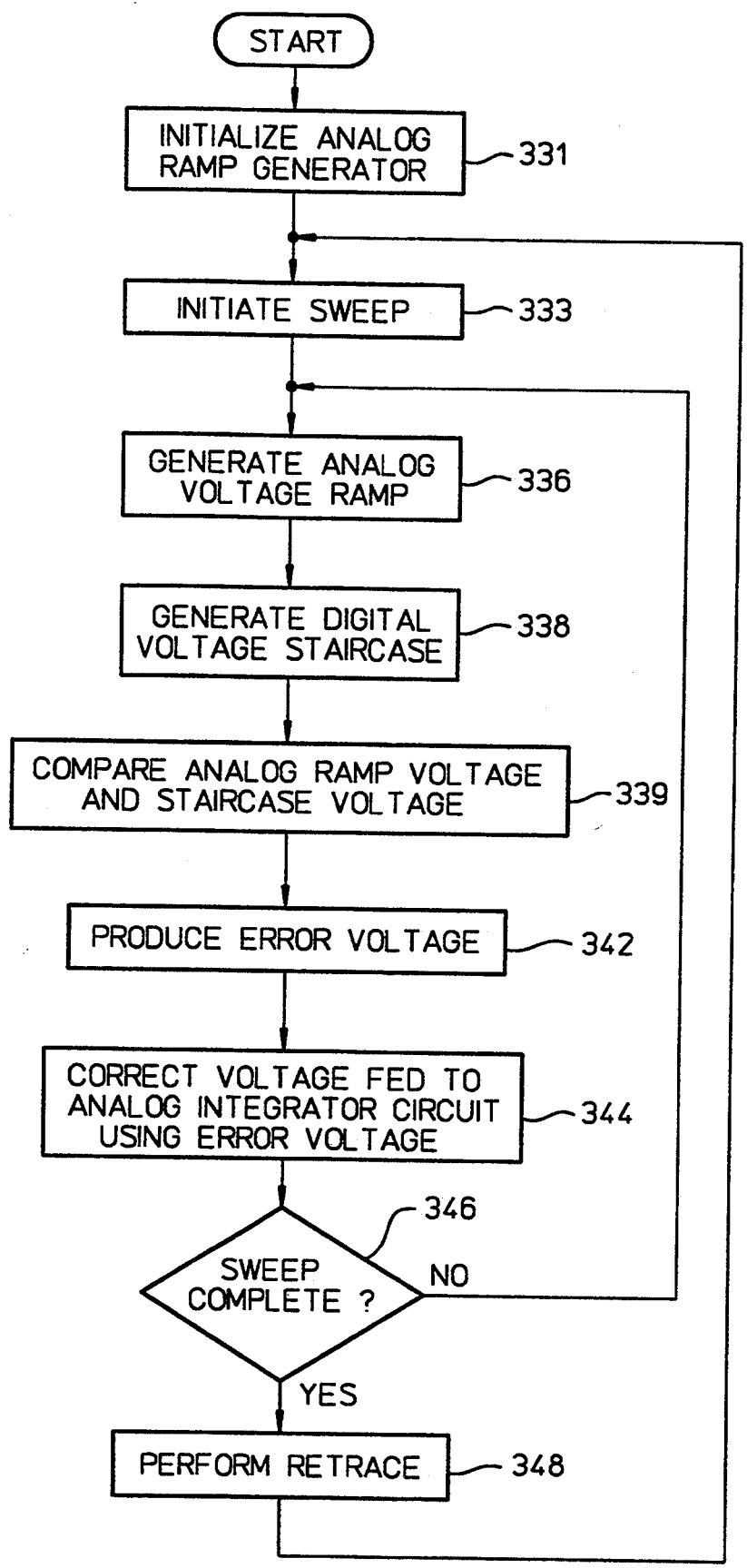
FIG. 5 is a flow chart of one embodiment of the method in accordance with the invention for digitally correcting an analog voltage ramp.

The timer/control circuit 110 opens the sweep switch 111 at a stop time T2, as illustrated by the numeral 345 shown in FIG. 4 and as determined by the numeral 346 shown in FIG. 5. Before another sweep begins, the timer/control circuit 110 closes the retrace switch 112 to drive the output of the analog integrator circuit 102 to the retrace voltage, as illustrated by the numeral 347 shown in FIG. 4 and as indicated by the numeral 348 shown in FIG. 5. After retrace is complete, the digitally-corrected analog ramp generator 322 is ready for another sweep.

The foregoing description is offered primarily for purposes of illustration. Although only one embodiment of the invention is disclosed herein, modifications and changes will be readily apparent to those skilled in the art, which modifications and enhancements are within the spirit and scope of the invention and intended to be covered by the claims set forth below.

What is claimed is:

1. A circuit for correcting errors in an analog ramp generator, the analog ramp generator comprising an analog integrator circuit responsive to a reference signal applied to the analog integrator circuit for generating an analog ramp signal, the correction circuit comprising:
   means for generating a corresponding digital ramp signal;
   means connected to the analog integrator circuit and to the digital ramp signal generating means for producing an error signal based on a difference between the digital and analog ramp signals; and
   means connected to the error signal producing means and responsive to the error signal and the reference signal for feeding back the error signal to the analog integrator circuit;
   whereby the analog ramp signal is forced to track the digital ramp signal.

2. A correction circuit as in claim 1 wherein the means for generating the corresponding digital ramp signal comprises:
   a timer circuit for generating counts; and
   a digital-ramp digital-to-analog converter (DAC) connected to the timer and responsive to the counts for generating a digital staircase signal.

3. A correction circuit as in claim 2 wherein the means for producing an error signal comprises:
   comparison means connected to the analog integrator circuit and to the digital ramp signal generating means for producing a difference signal between the digital and analog ramp signals;
   a loop-gain digital-to-analog converter (DAC) connected to the comparison means and responsive to the difference signal for scaling the difference signal depending on a predetermined number of steps comprising the digital ramp signal; and
   a sample-and-hold circuit connected to the loop-gain DAC for sampling the scaled difference signal to provide the error signal, the sample-and-hold circuit sampling the scaled difference signal during each step and holding the error signal constant until the next step;
   the loop-gain DAC controlling the gain so that the error signal changes the ramp rate of the analog ramp signal an amount to make the analog ramp signal equal the digital ramp signal at the next sample time.

4. A correction circuit as in claim 3 wherein the comparison means comprises an analog summer.

5. A correction circuit as in claim 1 wherein the means for producing an error signal comprises:
   comparison means connected to the analog integrator circuit and to the digital ramp signal generating means for producing a difference signal between the digital and analog ramp signals;
   a loop-gain digital-to-analog converter (DAC) connected to the comparison means and responsive to the difference signal for scaling the difference signal depending on a predetermined number of steps comprising the digital ramp signal; and
   a sample-and-hold circuit connected to the loop-gain DAC for sampling the scaled difference signal to provide the error signal, the sample-and-hold circuit sampling the scaled difference signal during each step and holding the error signal constant until the next step;
   the loop-gain DAC controlling the gain so that the error signal changes the ramp rate of the analog ramp signal an amount to make the analog ramp signal equal the digital ramp signal at the next sample time.

6. A correction circuit as in claim 5 wherein the comparison means comprises an analog summer.

7. A correction circuit as in claim 5 wherein the means connected to the error signal producing means and responsive to the error signal and the reference signal for feeding back the error signal to the analog integrator circuit comprises:
   an amplifier connected to the sample-and-hold circuit for amplifying the error signal;
   an analog summer connected to the amplifier and responsive to the amplified error signal and the reference signal for producing a combined signal; and
   a sweep-rate digital-to-analog converter (DAC) having an analog input connected to the analog summer and an analog output connected to the analog integrator circuit for scaling the combined signal.

8. A correction circuit as in claim 1 wherein the means connected to the error signal producing means and responsive to the error signal and the reference signal for feeding back the error signal to the analog integrator circuit comprises:
   an amplifier connected to the error signal producing means for amplifying the error signal;
   an analog summer connected to the amplifier and responsive to the amplified error signal and the reference signal for producing a combined signal; and
   a sweep-rate digital-to-analog converter (DAC) having an analog input connected to the analog summer and an analog output connected to the analog integrator circuit for scaling the combined signal.

9. In a swept-frequency test oscillator comprising an analog ramp generator for controlling the frequency of the swept-frequency test oscillator, the analog ramp generator comprising an analog integrator circuit responsive to a reference signal applied to the analog integrator circuit for generating an analog ramp signal to provide a control signal for the swept-frequency test oscillator, an improved correction circuit comprising:
   means for generating a corresponding digital ramp signal;
   means connected to the analog integrator circuit and to the digital ramp signal generating means for producing an error signal based on a difference between the digital and analog ramp signals; and
   means connected to the error signal producing means and responsive to the error signal and the reference signal for feeding back the error signal to the analog integrator circuit;
   whereby the analog ramp signal is forced to track the digital ramp signal.

10. A correction circuit as in claim 9 wherein the means for generating the corresponding digital ramp signal comprises:
    a timer circuit for generating counts; and
    a digital-ramp digital-to-analog converter (DAC) connected to the timer and responsive to the counts for generating a digital staircase signal.

11. A correction circuit as in claim 10 wherein the means for producing an error signal comprises:
    comparison means connected to the analog integrator circuit and to the digital ramp signal generating means for producing a difference signal between the digital and analog ramp signals;

a loop-gain digital-to-analog converter (DAC) connected to the comparison means and responsive to the difference signal for scaling the difference signal depending on a predetermined number of steps comprising the digital ramp signal; and a sample-and-hold circuit connected to the loop-gain DAC for sampling the scaled difference signal to provide the error signal, the sample-and-hold circuit sampling the scaled difference signal during each step and holding the error signal constant until the next step;

the loop-gain DAC controlling the gain so that the error signal changes the ramp rate of the analog ramp signal an amount to make the analog ramp signal equal the digital ramp signal at the next sample time.

12. A correction circuit as in claim 11 wherein the comparison means comprises an analog summer.

13. A correction circuit as in claim 9 wherein the means for producing an error signal comprises:

comparison means connected to the analog integrator circuit and to the digital ramp signal generating means for producing a difference signal between the digital and analog ramp signals;

a loop-gain digital-to-analog converter (DAC) connected to the comparison means and responsive to the difference signal for scaling the difference signal depending on a predetermined number of steps comprising the digital ramp signal; and a sample-and-hold circuit connected to the loop-gain DAC for sampling the scaled difference signal to provide the error signal, the sample-and-hold circuit sampling the scaled difference signal during each step and holding the error signal constant until the next step;

the loop-gain DAC controlling the gain so that the error signal changes the ramp rate of the analog ramp signal an amount to make the analog ramp signal equal the digital ramp signal at the next sample time.

14. A correction circuit as in claim 13 wherein the comparison means comprises an analog summer.

15. A correction circuit as in claim 13 wherein the means connected to the error signal producing means and responsive to the error signal and the reference signal for feeding back the error signal to the analog integrator circuit comprises:

an amplifier connected to the sample-and-hold circuit for amplifying the error signal;

an analog summer connected to the amplifier and responsive to the amplified error signal and the reference signal for producing a combined signal; and a sweep-rate digital-to-analog converter (DAC) having an analog input connected to the analog summer and an analog output connected to the analog integrator circuit for scaling the combined signal.

16. A correction circuit as in claim 9 wherein the means connected to the error signal producing means and responsive to the error signal and the reference signal for feeding back the error signal to the analog integrator circuit comprises:

an amplifier connected to the error signal producing means for amplifying the error signal;

an analog summer connected to the amplifier and responsive to the amplified error signal and the reference signal for producing a combined signal; and a sweep-rate digital-to-analog converter (DAC) having an analog input connected to the analog summer and an analog output connected to the analog integrator circuit for scaling the combined signal.

17. A method for correcting errors in an analog ramp generator, the analog ramp generator comprising an analog integrator circuit responsive to a reference signal applied to the analog integrator circuit for generating an analog ramp signal, the correction method comprising the steps of:

generating a corresponding digital ramp signal;

producing an error signal based on a difference between the digital and analog ramp signals; and responding to the error signal for combining the error signal and the reference signal and feeding the combined signal to the analog integrator circuit, thereby forcing the analog ramp signal to track the digital ramp signal.

18. A correction method as in claim 17 wherein the step of generating the corresponding digital ramp signal comprises the steps of:

generating counts; and responding to the counts for generating a digital staircase signal.

19. A correction method as in claim 17 wherein the step of producing an error signal comprises the steps of:

producing a difference signal between the digital and analog ramp signals;

responding to the difference signal for scaling the difference signal depending on a predetermined number of steps comprising the digital ramp signal; and sampling the scaled difference to provide the error signal during each step and holding the error signal constant until the next step.

20. A correction method as in claim 17 wherein the step of responding to the error signal for combining the error signal and the reference signal and feeding the combined signal to the analog integrator circuit comprises the steps of:

summing the error signal and the reference signal for producing the combined signal;

scaling the combined signal; and feeding the combined signal to the analog integrator circuit.

* * * * *